United States Patent
Su et al.

(10) Patent No.: US 8,611,071 B2
(45) Date of Patent: Dec. 17, 2013

(54) POWER SUPPLY STRUCTURE OF A MULTI-POWER-SUPPLY SYSTEM

(75) Inventors: Chun-Lung Su, New Taipei (TW); Yi-Wen Lin, New Taipei (TW)

(73) Assignee: Zippy Technology Corp., New Taipei (TW)

(*) Notice: Subject to any disclaimer, the term of this patent is extended or adjusted under 35 U.S.C. 154(b) by 280 days.

(21) Appl. No.: 13/243,513

(22) Filed: Sep. 23, 2011

(65) Prior Publication Data

US 2013/0077209 A1   Mar. 28, 2013

(51) Int. Cl.
  *H02B 1/26*  (2006.01)
  *H02B 1/20*  (2006.01)

(52) U.S. Cl.
  USPC ........... 361/622; 361/715; 361/727; 361/730; 361/826; 361/827

(58) Field of Classification Search
  None
  See application file for complete search history.

(56) References Cited

U.S. PATENT DOCUMENTS

| | | | | |
|---|---|---|---|---|
| 5,193,050 A | * | 3/1993 | Dimmick et al. | 361/694 |
| 5,224,020 A | * | 6/1993 | Golledge et al. | 361/679.48 |
| 6,315,655 B1 | * | 11/2001 | McEwan et al. | 454/184 |
| 6,661,656 B2 | * | 12/2003 | Kim et al. | 361/679.33 |
| 7,397,670 B2 | * | 7/2008 | Su | 361/752 |
| 8,159,849 B2 | * | 4/2012 | Nakajima et al. | 363/131 |
| 2008/0266791 A1 | * | 10/2008 | Li et al. | 361/695 |

FOREIGN PATENT DOCUMENTS

| | | |
|---|---|---|
| TW | 407819 | 10/2000 |
| TW | I259753 | 8/2006 |

* cited by examiner

*Primary Examiner* — Gregory Thompson
(74) *Attorney, Agent, or Firm* — Muncy, Geissler, Olds & Lowe, PLLC

(57) ABSTRACT

A power supply structure of a multi-power-supply system which is electrically connected to at least one power supply to get an output power provided by the power supply. The multi-power-supply system includes a power integration back panel and a casing. The power integration back panel is electrically connected to a DC output port and has at least one output cord to receive the power provided by the power supply. The casing has a housing compartment to hold the power integration back panel, an opening for loading the power supply into the housing compartment, and at least one partition to divide the housing compartment to form a space to hold the power supply, a wiring space threaded through by the output cord, and a power supply port exposed outside the surface of the casing to electrically connect to the output cord.

8 Claims, 6 Drawing Sheets

POWER SUPPLY STRUCTURE OF A MULTI-POWER-SUPPLY SYSTEM

FIELD OF THE INVENTION

The present invention relates to a power supply structure of a multi-power-supply system and particularly to a multi-power-supply system with changed power output positions.

BACKGROUND OF THE INVENTION

Setting up a website or database requires a huge data storage system and processing system, and also has to install a stable power supply system to provide electric power to those devices. To make the power supply system stable and provide regular power during system maintenance, the power supply system usually includes a plurality of power supplies and at least one power integration back panel to converge electric power of the power supplies, and then deliver the electric power through a plurality of output ports.

Reference of the aforesaid power supply system can be found in R.O.C. patent No. 407819 entitled "Modular multi-power supply" which includes a cabinet containing a plurality of housing compartments each has an opening, a plurality of power supplies and a loadable control box. The cabinet has a control back panel fastened longitudinally corresponding to the openings of the housing compartments. The control back panel has first connectors corresponding to the housing compartments and a plurality of DC output ends electrically connected to the first connectors. Each power supply has a second connector. When the power supply is installed in each housing compartment, the second connector is electrically connect with the first connector so that electric power output from the power supplies are converged on the control back panel.

The aforesaid conventional technique discloses a basic structure of the power supply system. R.O.C. patent No. 1259753 discloses a detailed structure of the aforesaid power supply system. It has a power supply module with an AC/DC power connection structure which includes a cabinet, at least two power processing modules and at least two secondary circuit boards. The cabinet is divided into at least two housing compartments by a partition. The cabinet has one end with an AC power connection port and a DC power connection port corresponding to each housing compartment. Each power processing module has a main circuit board and a power processing unit on the main circuit board. The main circuit board has a DC power connection end connecting to the DC power connection port. The secondary circuit board has an AC power connection end connecting to the AC power connection port. The secondary circuit board further is electrically connected to the power processing module.

In the power supply system of aforesaid conventional techniques, the cabinet has an opening at the front end to load the power supply. The power integration back panel is located at the rear end of the cabinet. The output ports of the power integration back panel face the rear end of the cabinet. However, the power supply system usually is installed close to a wall because of indoor spatial arrangement consideration. During repairs and maintenance the entire power supply system has to be moved to give technicians sufficient room to do the work. Moreover, with the output ports of the power integration back panel located at the rear end of the cabinet, a portion of space is occupied to decrease the space for installing cooling air fans. Furthermore, in the conventional power supply system, the front end and rear end of the power supply are inserted by a great deal of power cords. It is unsightly, and wiring configuration and management are more difficult.

SUMMARY OF THE INVENTION

In view of the conventional power supply system having the output and input connectors respectively located at two sides that creates problems in repair and maintenance and space allocation, the object of the present invention is to provide an improved power supply system with power input and output connection at one side to facilitate repair and maintenance, and also improve utilization of the internal space of the power supply system.

The present invention provides a power supply structure of a multi-power-supply system which is electrically connected to at least one power supply to get an output power provided by the power supply. The multi-power-supply system includes a power integration back panel and a casing. The power integration back panel is electrically connected to a DC output port. The power integration back panel has at least one output cord to receive the power provided by the power supplies. The casing has a housing compartment to hold the power integration back panel, an opening for loading the power supply into the housing compartment and at least one partition to divide the housing compartment to form a space to hold the power supply and a wiring space threaded through by the output cord, and including at least one power supply port exposed outside the surface of the casing to electrically connect to the output cord.

In an embodiment of the invention, the partition has an output cord channel threaded through by the output cord to electrically connect to the power supply port exposed outside the surface of the casing. The casing has a plurality of partitions to divide the housing compartment to hold a plurality of power supplies. The surface of the casing also has multiple power supply ports corresponding to the power supplies. Each partition has its own output cord channel to direct the output cord. The power supply ports pass through the partitions to enter the output cord channel to electrically connect to output cord. The partition is divided into an opening side close to the opening, a top side at the top, a bottom side at the bottom, and a rear side opposite to the opening side. The output cord channel has at least one notch facing the rear side threaded through by the output cord. The power supply loaded into the housing compartment includes an output side with the DC output port formed thereon and an input side with an AC input port formed thereon. The opening side of the partition is extended to the opening of the casing to separate the input side of another neighboring power supply. In addition, the power supply port runs through the opening side of the partition, or the top side or the bottom side to be exposed outside the surface of the casing.

In another embodiment, the partition simply divides the housing compartment to form space to hold the power supplies. The housing compartment has other space to be threaded through by the output cord. Moreover, the power supply port is located on the opening to electrically connect to the output cord.

By means of the features set forth above, the output cord of the power integration back panel can pass through the output cord channel to electrically connect to the power supply port. As the power supply port is located at the opening side of the partition, or the top side or the bottom side to be exposed outside the surface of the casing, there is no need to allocate space at the back side of the casing for wiring purpose. Repairs and maintenance can be performed at one side to connect electric power for input and output, and utilization of the internal space of the power supply system improves.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
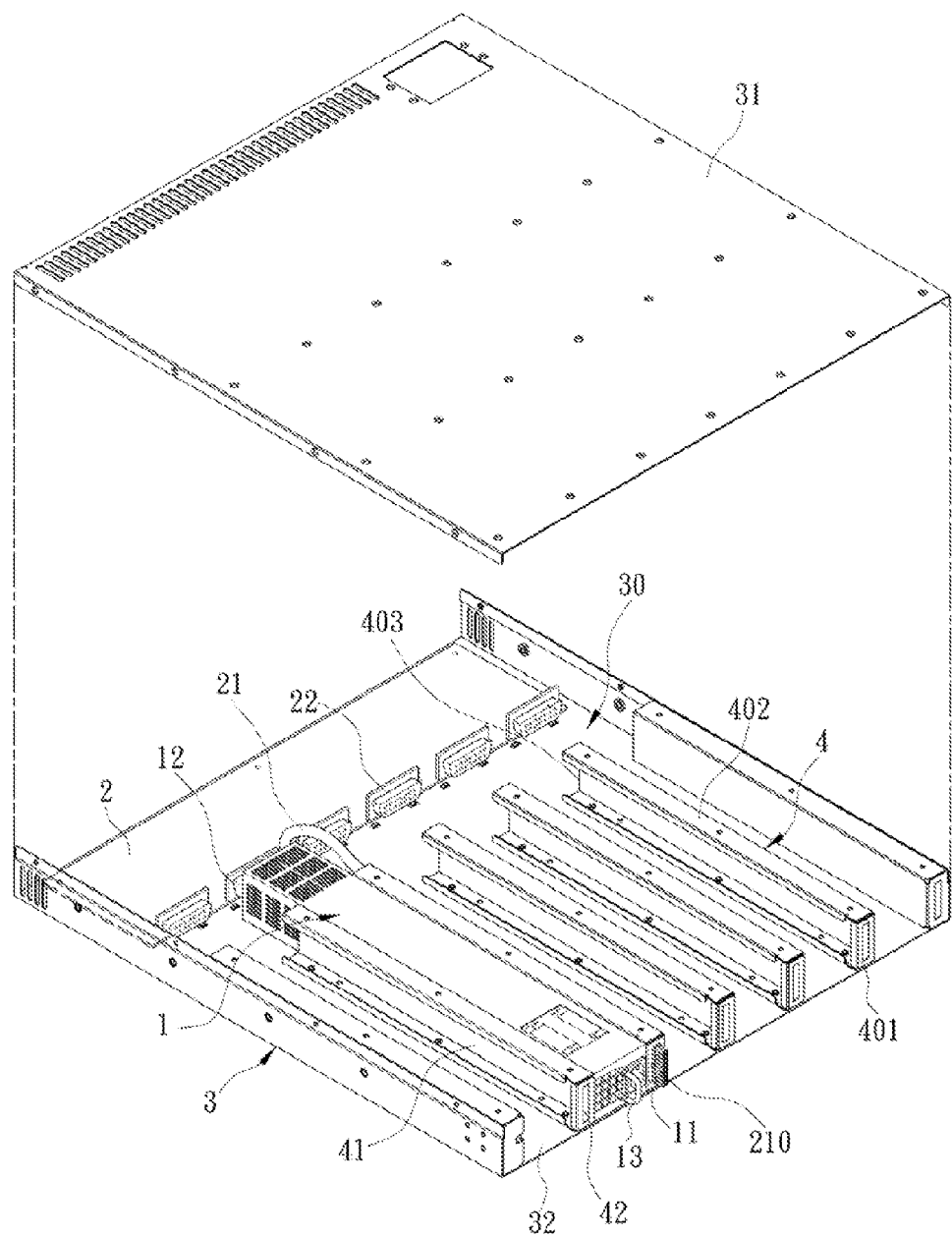
FIG. 1 is an exploded view of a first embodiment of the invention.
Figure 2:
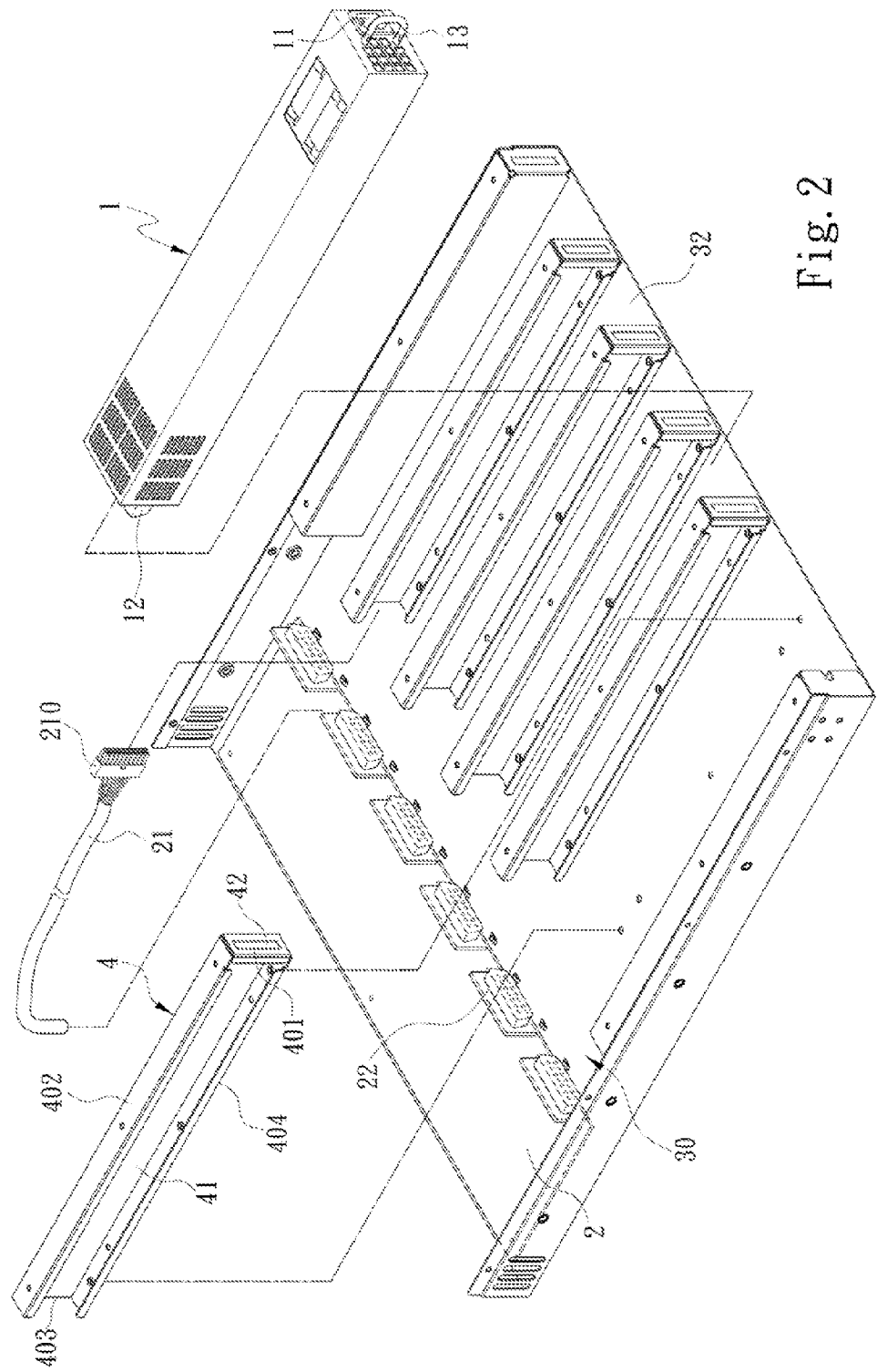
FIG. 2 is another exploded view of the first embodiment of the invention.
Figure 3:
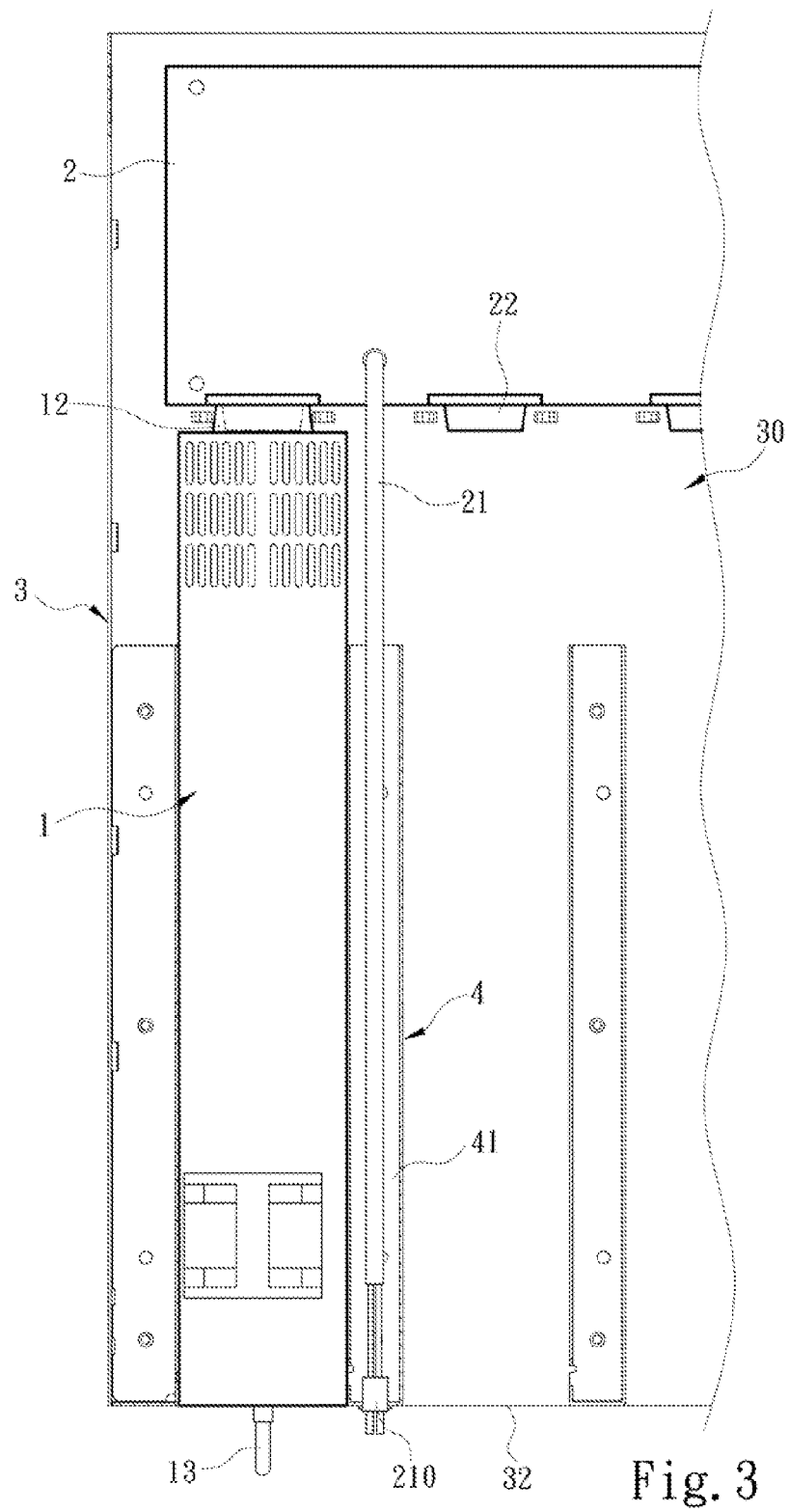
FIG. 3 is a fragmentary cross section of the first embodiment of the invention.

Please refer to FIGS. 1, 2 and 3 for a first embodiment of the multi-power-supply system of the invention. It includes a casing 3 containing a housing compartment 30 to hold at least one power supply 1, a power integration back panel 2 and at least one partition 4. The casing 3 includes a cover lid 31 and an opening 32. The partition 4 is held in the housing compartment to divide thereof to hold the power supply 1. In the first and second embodiments of the invention, the casing 3 has a plurality of partitions 4 to hold multiple power supplies 1. Each power supply 1 has an input side with an AC input port 11 and a handle 13, and an output side with a DC output port 12. The power supply 1 is loaded into the housing compartment 30 through the opening 32 by the guiding of the partition 4. The power integration back panel 2 has a plurality of back panel input ports 22 electrically connected to the DC output port 12 of the power supply 1 loaded into the casing 3 so that an output power generated by the power supply 1 is converged on the power integration back panel 2. The power integration back panel 2 can be connected to one or more power supplies 1 to converge and output electric power. The power integration back panel 2 further has at least one output cord 21 to output the electric power converged by the power integration back panel 2. In the first embodiment, each partition 4 has one output cord channel 41 threaded through by the output cord 21 which also passes through a power supply port 210 of the partition 4 to electrically connect therewith (referring to FIG. 3). The partition 4 can be divided to form an opening side 401 close to the opening 32, a top side 402 at the top, a bottom side 404 at the bottom, and a rear side 403 opposite to the opening side 401. The opening side 401 is extended to the opening 32 to separate the input side of another neighboring power supply 1. The output cord channel 41 also has at least one notch facing the rear side 403 threaded through by the output cord 21. In addition, the power supply port 210 runs through the opening side 401, or the top side 402, or the bottom side 404 to electrically connect to the output cord 21. The first embodiment shown in FIGS. 1 and 2 has the power supply port 210 run through the opening side 401. The output cord 21 enters the output cord channel 41. The partition 4 has a slot 42 corresponding to the power supply port 210 wiring out from the opening side 401. The power supply port 210 runs through the slot 42. The output cord 21 is electrically connected to the power supply port 210 to direct the electric power from the power integration back panel 2 for outputting.

Figure 4:
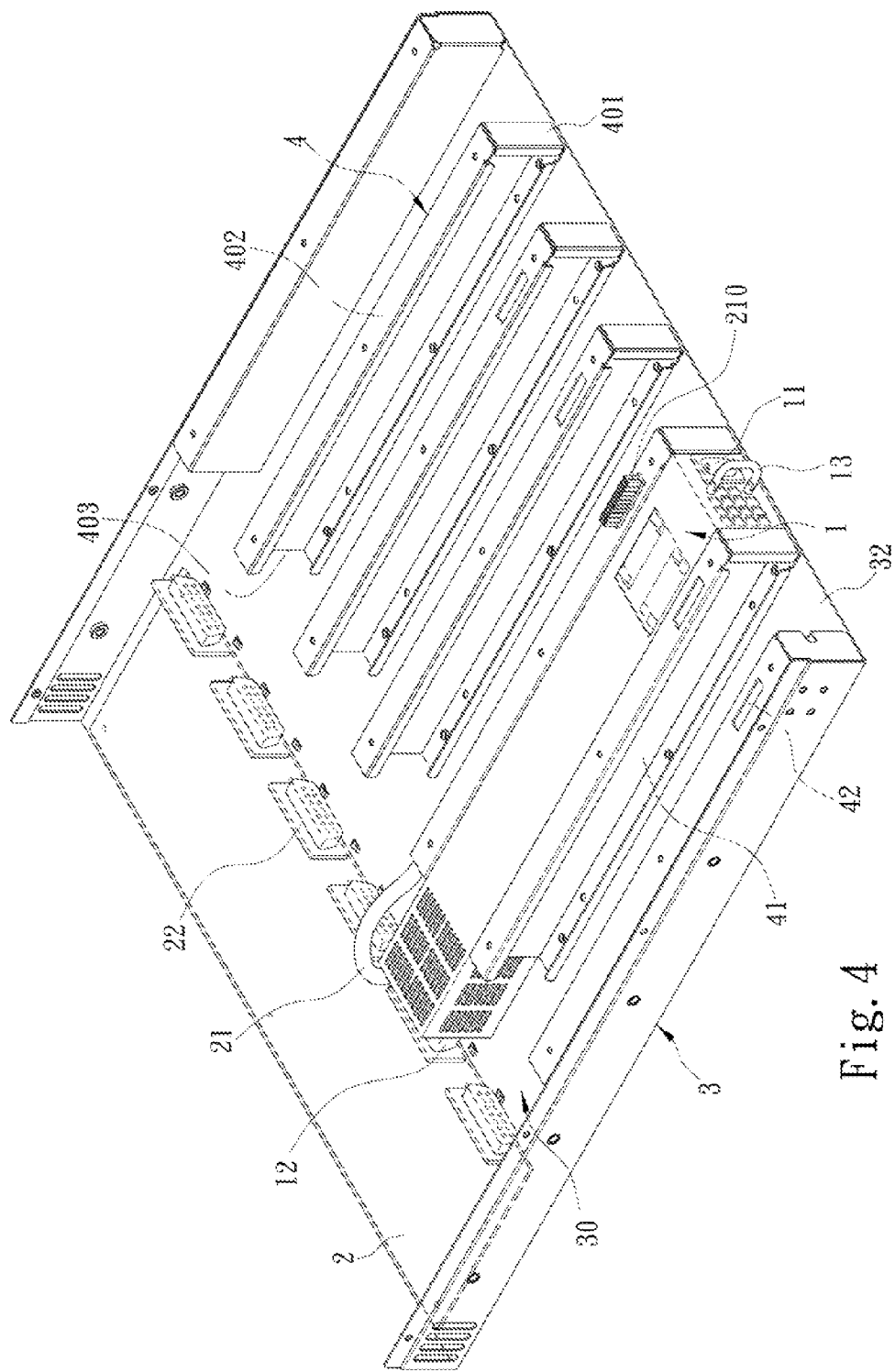
FIG. 4 is an exploded view of a second embodiment of the invention.

Please refer to FIG. 4 for the second embodiment of the invention. As previously discussed, the power supply port 210 runs through the top side 402 of the partition 4, and the casing 3 has the opening to allow the power supply port 210 to be exposed outside the surface of the casing 3. The first and second embodiments illustrate the power supply port 210 run through the opening side 401 and top side 402. Similarly, the power supply port 210 can also run through the bottom side 404 and located thereon as can be easily known by those skilled in the art.

Figure 5:
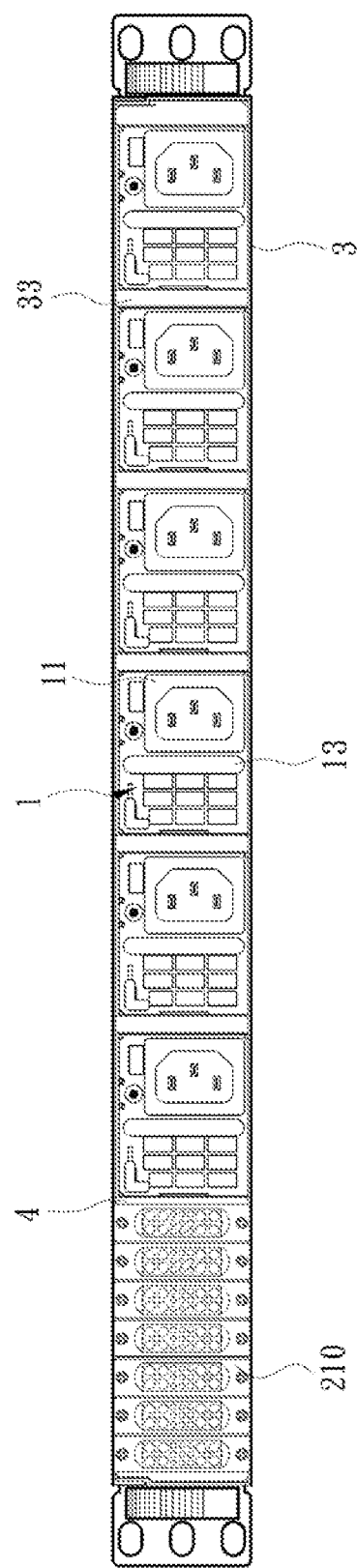
FIG. 5 is a schematic view of a third embodiment of the invention.
Figure 6:
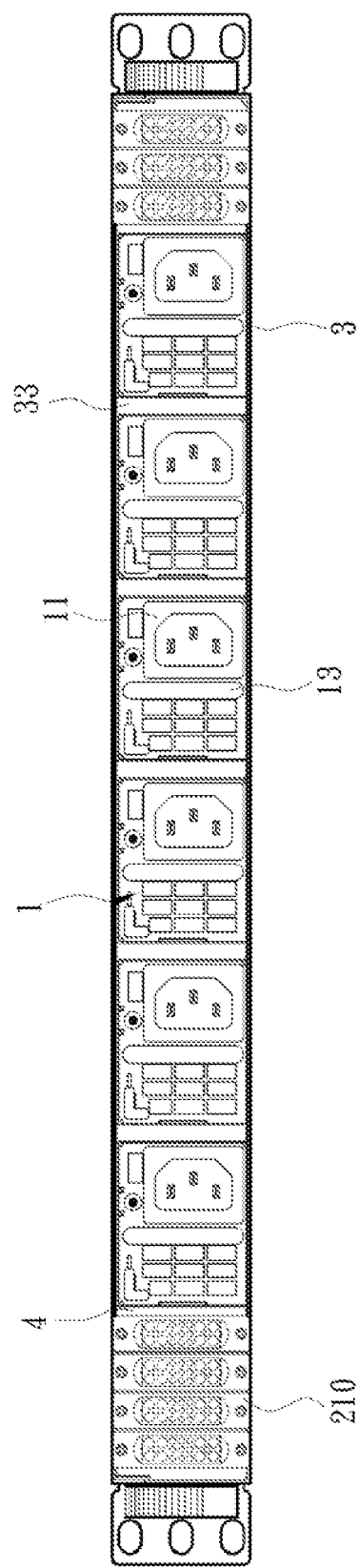
FIG. 6 is a schematic view of a fourth embodiment of the invention.

FIG. 5 shows a third embodiment in which the partition 4 divides the housing compartment 30 to form space to hold the power supplies 1 at separate locations. Neighboring power supplies 1 are separated by a spacer 33. The housing compartment divided by the partition 4 has other spared space to allow the output cord 21 to thread through. Moreover, the power supply port 210 is located on the opening 32 to electrically connect to the output cord 21. As previously discussed, in the third embodiment, the partition 4 separates the power supply ports 210 from the power supplies 1, so that the power supply ports 210 are gathered at the left side and right side of the casing 3. FIG. 6 illustrates a fourth embodiment which also adopts the technique previously discussed, but with the power supply ports 210 gathered at one side of the casing 3 to facilitate position arrangement of the power supply ports 210 to meet user's requirements.

By means of the features set forth above, the partition 4 can divide to form a space to allow the output cord 21 to electrically connect to the power supply port 210. Hence the output power from the power integration back panel 2 can be delivered by wiring in directions different from the conventional techniques to form electric connection with other equipment. As a result, output of the multi-power-supply system can match operation requirements of system maintenance people by changing the direction of the power supply port 210. And extra space can be spared at the back side panel of the multi-power-supply system for installation of cooling fans or radiation vents to improve cooling power.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A power supply structure of a multi-power-supply system which is electrically connected to at least one power supply to get an output power therefrom, the multi-power-supply system comprising:

a power integration back panel which is electrically connected to a DC output port of the power supply that provides the output power and includes at least one output cord connected to the power supply to receive the power from the power supply; and a casing which includes a housing compartment to hold the power integration back panel, an opening for loading the power supply into the housing compartment and at least one partition, the partition dividing the housing compartment to form a space to hold the power supply and a wiring space threaded through by the output cord and including at least one power supply port exposed outside the surface of the casing to electrically connect to the output cord.

2. The power supply structure of the multi-power-supply system of claim 1, wherein the partition includes an output cord channel threaded through by the output cord to form electrical connection with the power supply port.

3. The power supply structure of the multi-power-supply system of claim 2, wherein the casing includes a plurality of partitions and a plurality of power supply ports which run through the surface of the casing and anchor thereon, each partition including one output cord channel threaded through by the output cord to form electrical connection with the power supply port.

4. The power supply structure of the multi-power-supply system of claim 2, wherein the power supply port passes through the partition to enter the output cord channel to form electrical connection with the output cord.

5. The power supply structure of the multi-power-supply system of claim 1, wherein the partition is divided into an opening side close to the opening, a top side on the top, a bottom side on the bottom and a rear side opposite to the opening side, the output cord channel of the partition including at least one notch facing the rear side to receive the output cord.

6. The power supply structure of the multi-power-supply system of claim 5, wherein the power supply port passes through the opening side, top side or bottom side of the partition to be exposed outside the surface of the casing.

7. The power supply structure of the multi-power-supply system of claim 5, wherein the power supply includes an output side to hold the DC output port and an input side to hold an AC input port, the opening side of the partition being extended to the opening of the casing to separate the input side of another neighboring power supply.

8. The power supply structure of the multi-power-supply system of claim 1, wherein the power supply port is positioned on the opening.

\* \* \* \* \*